(12) United States Patent
Pan et al.

(10) Patent No.: US 11,673,795 B2
(45) Date of Patent: Jun. 13, 2023

(54) DETACHABLE MEMS PACKAGE TOP COVER

(71) Applicant: Beijing Voyager Technology Co., Ltd., Beijing (CN)

(72) Inventors: Anan Pan, Fremont, CA (US); Youmin Wang, Mountain View, CA (US)

(73) Assignee: Beijing Voyager Technology Co., Ltd., Beijing (CN)

( * ) Notice: Subject to any disclaimer, the term of this patent is extended or adjusted under 35 U.S.C. 154(b) by 268 days.

(21) Appl. No.: 17/095,655

(22) Filed: Nov. 11, 2020

(65) Prior Publication Data

US 2022/0144626 A1    May 12, 2022

(51) Int. Cl.
*B81B 7/00* (2006.01)
*G01S 17/931* (2020.01)
*G01S 7/481* (2006.01)
*B81C 1/00* (2006.01)

(52) U.S. Cl.
CPC .......... *B81B 7/0058* (2013.01); *B81B 7/0038* (2013.01); *B81C 1/00285* (2013.01); *B81C 1/00317* (2013.01); *G01S 7/4813* (2013.01); *G01S 17/931* (2020.01); *B81B 2201/0292* (2013.01); *B81B 2201/042* (2013.01)

(58) Field of Classification Search
CPC ................ B81B 7/0058; B81B 7/0038; B81B 2201/0292; B81B 2201/042; B81B 7/0067; B81C 1/00285; B81C 1/00317; G01S 7/4813; G01S 17/931; G01S 7/4817; G02B 26/0833; G02B 26/101
See application file for complete search history.

(56) References Cited

U.S. PATENT DOCUMENTS

| 6,028,351 | A * | 2/2000 | Klonis | H01L 23/10 257/688 |
|---|---|---|---|---|
| 7,088,397 | B1 | 8/2006 | Hunter et al. | |
| 2004/0190111 | A1 * | 9/2004 | Callies | G02B 26/0833 359/291 |
| 2006/0055026 | A1 | 3/2006 | Wright | |
| 2010/0122583 | A1 * | 5/2010 | Rozgo | G01L 19/148 73/861.47 |
| 2013/0167482 | A1 * | 7/2013 | Fu | B65B 31/04 53/432 |
| 2016/0268324 | A1 | 9/2016 | Lin et al. | |
| 2017/0168136 | A1 * | 6/2017 | Bleyer | G01S 7/02 |

* cited by examiner

*Primary Examiner* — Yasser A Abdelaziez
(74) *Attorney, Agent, or Firm* — Kilpatrick Townsend & Stockton LLP

(57) ABSTRACT

A MEMS chip package is provided with a removable cover to allow non-destructive testing. The MEMS package has a container (with walls and a bottom) and a cover. The cover has a glass pane, and is secured to the MEMS package with an elastomeric gasket mounted between the walls of the MEMS package and the cover. A number of attachment mechanisms secure the cover to the MEMS package.

13 Claims, 10 Drawing Sheets

DETACHABLE MEMS PACKAGE TOP COVER

BACKGROUND OF THE INVENTION

Unless otherwise indicated herein, the materials described in this section are not prior art to the claims in this application and are not admitted to be prior art by inclusion in this section. In particular, disparate technologies are discussed that it would not be obvious to discuss together absent the teachings of the present invention.

Modern vehicles are often equipped with sensors designed to detect objects and landscape features around the vehicle in real-time to enable technologies such as lane change assistance, collision avoidance, and autonomous driving. Some commonly used sensors include image sensors (e.g., infrared or visible light cameras), acoustic sensors (e.g., ultrasonic parking sensors), radio detection and ranging (RADAR) sensors, magnetometers (e.g., passive sensing of large ferrous objects, such as trucks, cars, or rail cars), and light detection and ranging (LiDAR) sensors.

A LiDAR system typically uses a light source and a light detection system to estimate distances to environmental features (e.g., pedestrians, vehicles, structures, plants, etc.). For example, a LiDAR system may transmit a light beam (e.g., a pulsed laser beam) to illuminate a target and then measure the time it takes for the transmitted light beam to arrive at the target and then return to a receiver near the transmitter or at a known location. In some LiDAR systems, the light beam emitted by the light source may be steered across a two-dimensional or three-dimensional region of interest according to a scanning pattern, to generate a "point cloud" that includes a collection of data points corresponding to target points in the region of interest. The data points in the point cloud may be dynamically and continuously updated, and may be used to estimate, for example, a distance, dimension, location, and speed of an object relative to the LiDAR system.

Light steering typically involves the projection of light in a pre-determined direction to facilitate, for example, the detection and ranging of an object, the illumination and scanning of an object, or the like. Light steering can be used in many different fields of applications including, for example, autonomous vehicles, medical diagnostic devices, etc., and can be configured to perform both transmission and reception of light. For example, a light steering transmitter may include a micro-mirror to control the projection direction of light to detect/image an object. Moreover, a light steering receiver may also include a micro-mirror to select a direction of incident light to be detected by the receiver, to avoid detecting other unwanted signals. A micro-mirror assembly typically includes a micro-mirror and an actuator. In a micro-mirror assembly, a mirror-mirror can be connected to a substrate via a connection structure (e.g., a torsion bar, a spring, etc.) to form a pivot point. The actuator drives the micro mirror to rapidly scan a laser across an environment to be detected. The actuator typically drives the micro mirror at the resonant frequency of the micro mirror assembly to take advantage of the resonant frequency and use less power. One such type of micro-mirror assembly can be a micro-electro-mechanical system (MEMS)-type structure that may be used for a light detection and ranging (LiDAR) system in an autonomous vehicle, which can be configured for detecting objections and determining their corresponding distances from the vehicle. LiDAR systems typically work by illuminating a target with an optical pulse and measuring the characteristics of the reflected return signal. The return signal is typically captured as a point cloud. The width of the optical-pulse often ranges from a few nanoseconds to several microseconds.

In a LiDAR system, the MEMS components, such as micro mirror arrays, laser diodes and photodetectors, are affected by changes in temperature and the manufacturing process. Precise alignment of the components is desired. During a production run, semiconductor packages are tested for alignment and other errors. If a problem is detected, the package may be opened to examine the MEMS structure, such as by using a microscope. However, opening the package without damaging or affecting the components can be difficult. Glass is a commonly used solution to close the MEMS package and at the same time allow the egress and ingress of transmitted and received light. The glass lids are typically glued on top of MEMS optical packages.

BRIEF SUMMARY OF THE INVENTION

Techniques disclosed herein relate generally to microelectromechanical (MEMS) structures, such as micro mirrors, that can be used in, for example, light detection and ranging (LiDAR) systems or other light beam steering systems. More specifically, and without limitation, disclosed herein are apparatus and methods for removably attaching a cover to a MEMS package for a MEMS structure.

According to certain embodiments, a MEMS chip package is provided with a removable cover to allow non-destructive testing. The MEMS package has a container (with walls and a bottom) and a cover. The cover has a glass pane, and is secured to the MEMS package with an elastomeric gasket mounted between the walls of the MEMS package and the cover. A number of attachment mechanisms secure the cover to the MEMS package.

In one embodiment, there is a slot in the top of the walls of the MEMS container shaped to engage the elastomeric gasket. The elastomeric gasket has a curved cross-section, and the slot is curved to match the shape of the elastomeric gasket. The elastomeric gasket is silicon rubber that is overmolded on the cover. A glue or epoxy fastens the elastomeric gasket to the bottom perimeter of the cover, and then the cover and gasket are attached to the MEMS container.

In one embodiment, the attachment mechanisms are tabs attached to the outside walls of the MEMS container. The tabs have lips which extend over the cover to hold it in place and apply downward pressure to slightly compress the gasket. The tabs have slots beneath the lips for engaging the sides of the cover. The tabs are either attached to, or integrally formed with the MEMS container walls.

In one embodiment, a method is provided for assembling a MEMS package. The method includes enclosing a MEMS structure in a MEMS package, the MEMS package having a bottom and walls. A cover with a glass pane is provided. The method involves mounting an elastomeric gasket between the walls of the MEMS package and the cover. This includes removably attaching the cover to the MEMS package using a plurality of attachment mechanisms.

In one embodiment, the method involves first overmolding the elastomeric gasket, such as a silicon rubber O-ring, on the underside perimeter of the cover with an epoxy or glue. The cover is metal with a central glass pane. The combination cover and gasket are then snapped into place over the MEMS container, pressing the tabs outward until they snap back into place to secure the cover in place.

The terms and expressions that have been employed are used as terms of description and not of limitation, and there is no intention in the use of such terms and expressions of excluding any equivalents of the features shown and described or portions thereof. It is recognized, however, that various modifications are possible within the scope of the systems and methods claimed. Thus, it should be understood that, although the present system and methods have been specifically disclosed by examples and optional features, modification and variation of the concepts herein disclosed should be recognized by those skilled in the art, and that such modifications and variations are considered to be within the scope of the systems and methods as defined by the appended claims.

This summary is not intended to identify key or essential features of the claimed subject matter, nor is it intended to be used in isolation to determine the scope of the claimed subject matter. The subject matter should be understood by reference to appropriate portions of the entire specification of this disclosure, any or all drawings, and each claim.

The foregoing, together with other features and examples, will be described in more detail below in the following specification, claims, and accompanying drawings.

BRIEF DESCRIPTION OF THE DRAWINGS

The features of the various embodiments described above, as well as other features and advantages of certain embodiments of the present invention, will be more apparent from the following detailed description taken in conjunction with the accompanying drawings, in which.

DETAILED DESCRIPTION OF THE INVENTION

Aspects of the present disclosure relate generally to MEMS package assembly with a removable cover, and more particularly to the use and testing of such a package in a LiDAR system that scans an environment with a laser and MEMS-based mirror arrays.

In the following description, various examples of a MEMS package assembly with a removable cover are described. For purposes of explanation, specific configurations and details are set forth in order to provide a thorough understanding of the embodiments. However, it will be apparent to one skilled in the art that certain embodiments may be practiced or implemented without every detail disclosed. Furthermore, well-known features may be omitted or simplified in order to prevent any obfuscation of the novel features described herein.

Figure 3:
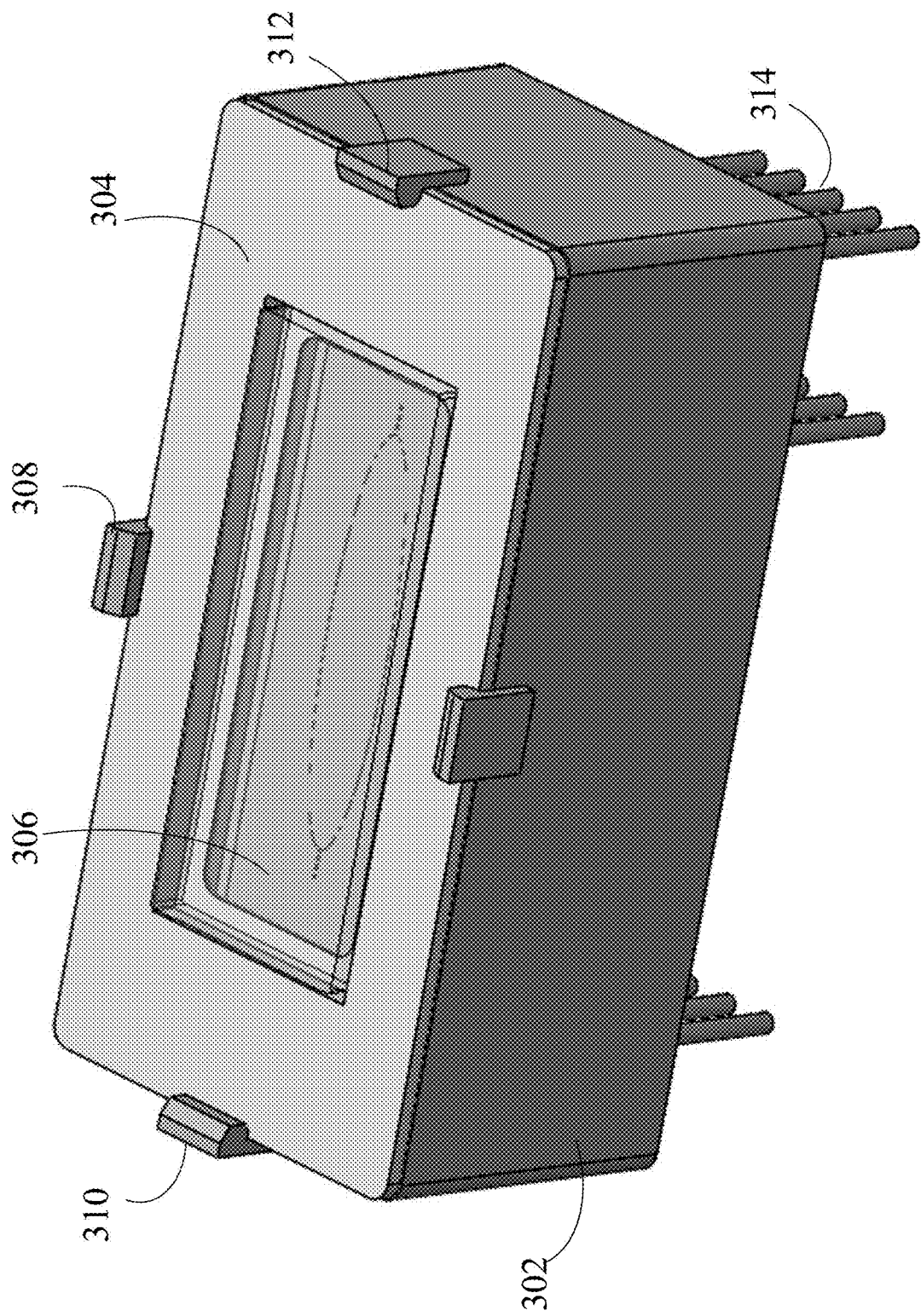
FIG. 3 illustrates a MEMS chip package with a removable cover according to embodiments of the invention.
Figure 4A:
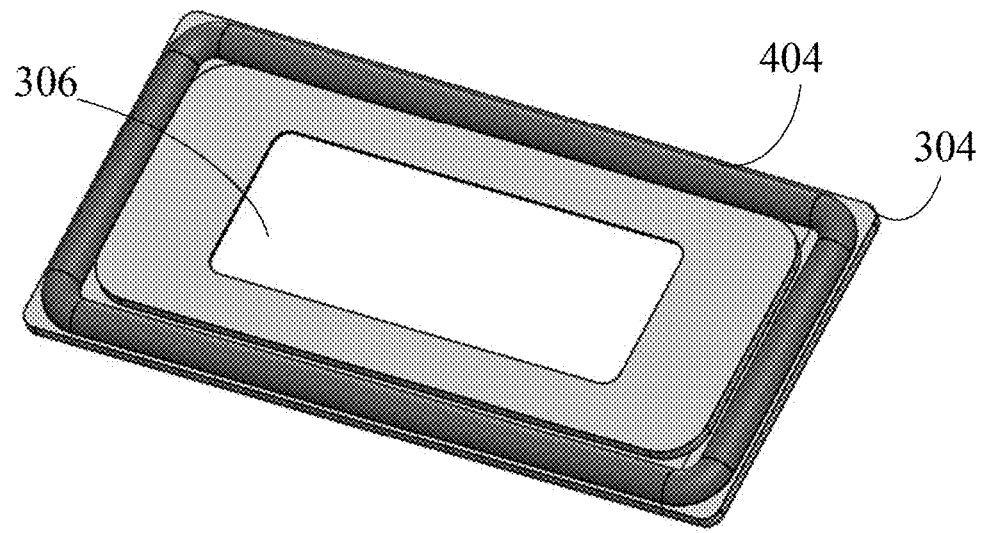
FIGS. 4A-4B illustrate the top cover and package body of the MEMS chip package or FIG. 3 according to embodiments of the invention.
Figure 4B:
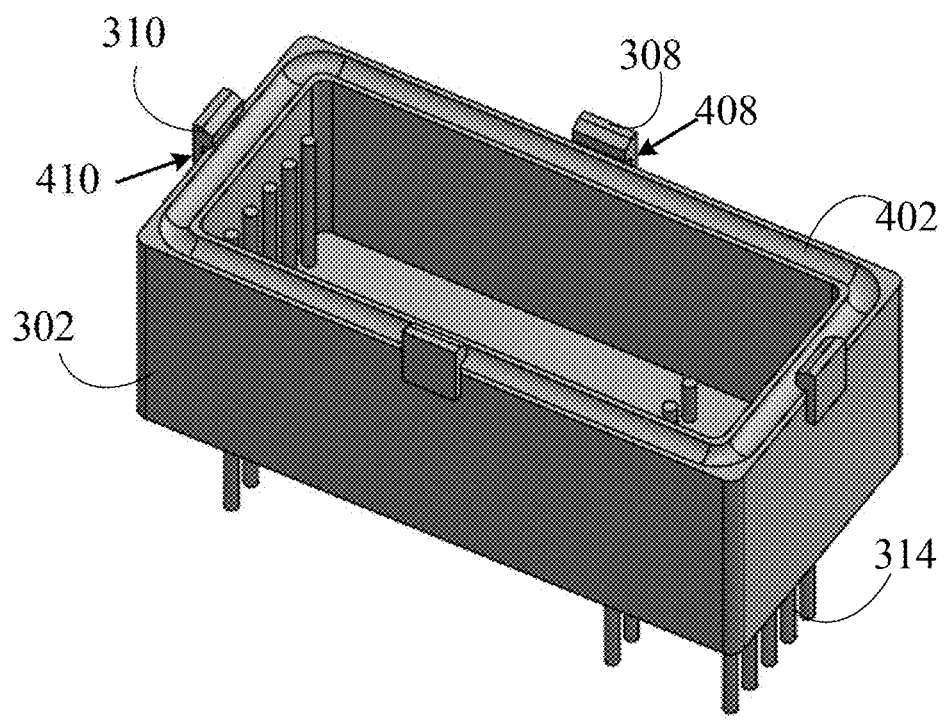
Figure 5:
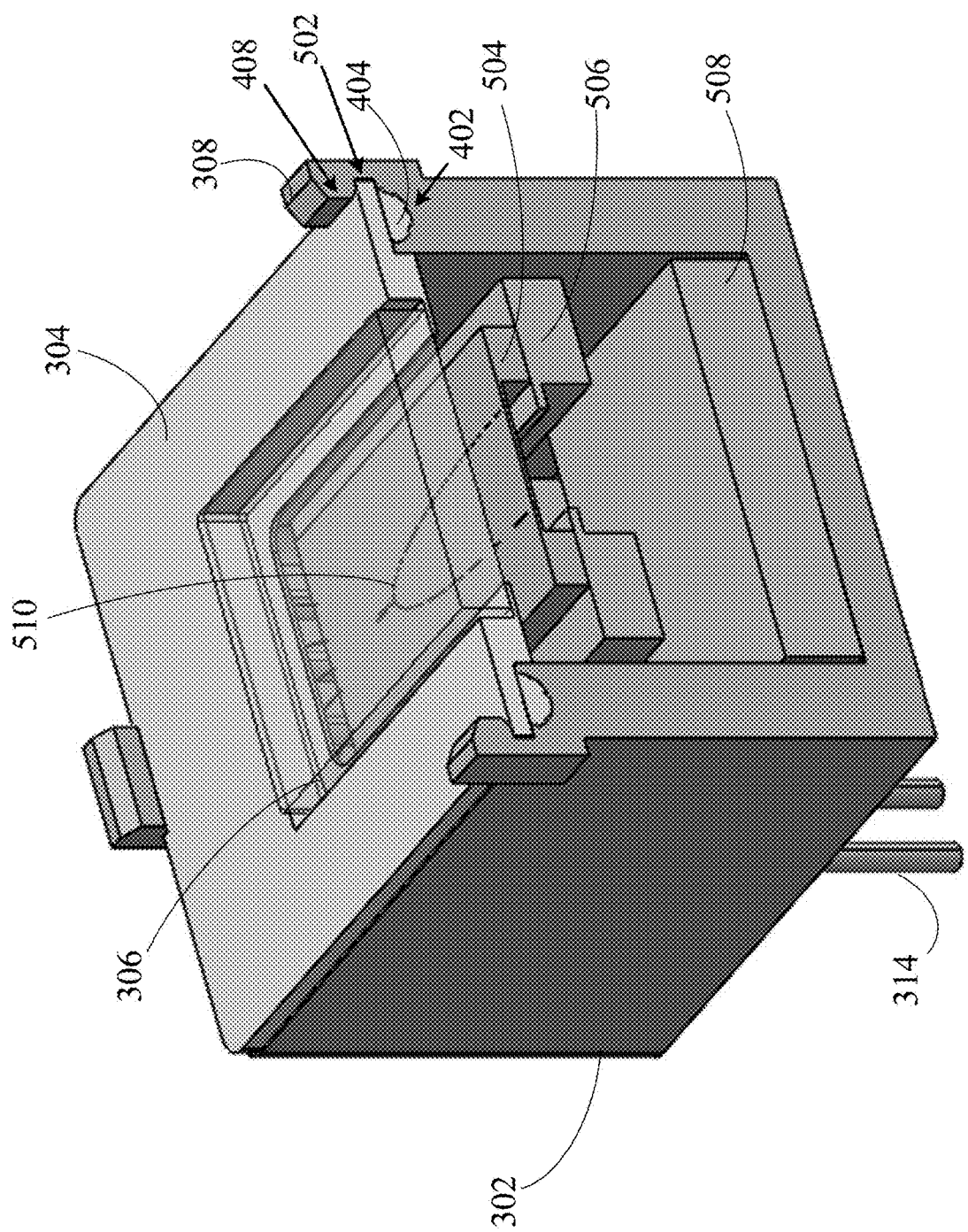
FIG. 5 is a cutaway view of the MEMS chip package of FIG. 3 according to embodiments of the invention.

The following high level summary is intended to provide a basic understanding of some of the novel innovations depicted in the figures and presented in the corresponding descriptions provided below. Techniques disclosed herein relate generally to a MEMS package assembly with a removable cover. According to certain embodiments, a MEMS chip package is provided with a removable cover to allow non-destructive testing. The MEMS package is shown in FIGS. 3-5. The MEMS package has a container 302 (with walls and a bottom) and a cover 304. The cover has a glass pane 306, and is secured to the MEMS package with an elastomeric gasket 404 mounted between the walls of the MEMS package and the cover. A number of attachment mechanisms 308-312 secure the cover to the MEMS package. The attachment mechanisms can be tabs on the sides of the walls, with lips extending over the cover and holding it in place. The cover can then be removed later to inspect the MEMS structure after testing. In addition to being removable, the attachment mechanism provides improved alignment of the cover over the package compared to gluing a cover on the package.

FIG. 3 illustrates an assembled MEMS chip package with a removable cover according to embodiments of the invention. FIGS. 4A-4B illustrate the disassembled top cover and package body, respectively, of the MEMS chip package of FIG. 3. FIG. 4A shows the underside of the cover 304 with glass pane 306 and a gasket 404 which can be a silicon rubber O-ring.

FIG. 4B shows the package 302 with a slot 402 around the perimeter on the top of the walls of the package to receive gasket 404. FIG. 5 is a cut-away view of the MEMS chip package of FIG. 3 according to embodiments of the invention. In addition to the slot, just above the slot are indentations (e.g., 502) in the tab 308 to receive the edge of cover 304.

Inside of package 302 is the MEMS structure, which can be a variety of structures. In one embodiment, a MEMS mirror or mirror array structure 510 is supported by a MEMS anchor 504. Other MEMS structures could be placed inside of a MEMS package, such as a photodetector structure or a laser diode structure or a different mirror or other optics structure.

Typical Lidar System Environment for Certain Embodiments of the Invention

Figure 1:
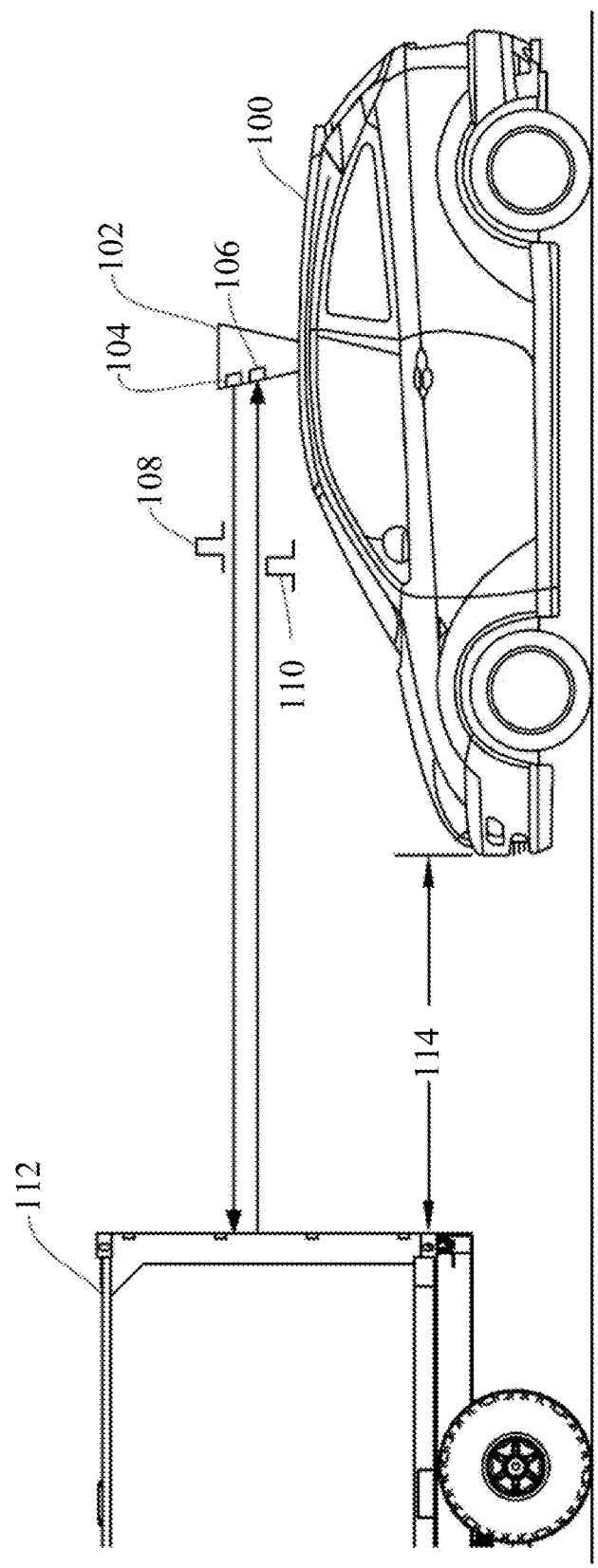
FIG. 1 shows an autonomous vehicle with a LiDAR system, according to certain embodiments.

FIG. 1 illustrates an autonomous vehicle 100 in which the various embodiments described herein can be implemented. Autonomous vehicle 100 can include a LiDAR module 102. LiDAR module 102 allows autonomous vehicle 100 to perform object detection and ranging in a surrounding environment. Based on the result of object detection and ranging, autonomous vehicle 100 can drive according to the rules of the road and maneuver to avoid a collision with detected objects. LiDAR module 102 can include a light steering transmitter 104 and a receiver 106. Light steering transmitter 104 can project one or more light signals 108 at various directions (e.g., incident angles) at different times in any suitable scanning pattern, while receiver 106 can monitor for a light signal 110 which is generated by the reflection of light signal 108 by an object. Light signals 108 and 110 may include, for example, a light pulse, a frequency modulated continuous wave (FMCW) signal, an amplitude modulated continuous wave (AMCW) signal, etc. LiDAR module 102 can detect the object based on the reception of light signal 110, and can perform a ranging determination (e.g., a distance of the object) based on a time difference between light signals 108 and 110, as would be appreciated by one of ordinary skill in the art with the benefit of this disclosure. For example, as shown in FIG. 1, LiDAR module 102 can transmit light signal 108 at a direction directly in front of autonomous vehicle 100 at time T1 and receive light signal 110 reflected by an object 112 (e.g., another vehicle) at time T2. Based on the reception of light signal 110, LiDAR module 102 can determine that object 112 is directly in front of autonomous vehicle 100. Moreover, based on the time difference between T1 and T2, LiDAR module 102 can also determine a distance 114 between autonomous vehicle 100 and object 112. Autonomous vehicle 100 can thereby adjust its speed (e.g., slowing or stopping) to avoid collision with object 112 based on the detection and ranging of object 112 by LiDAR module 102.

Figure 2A:
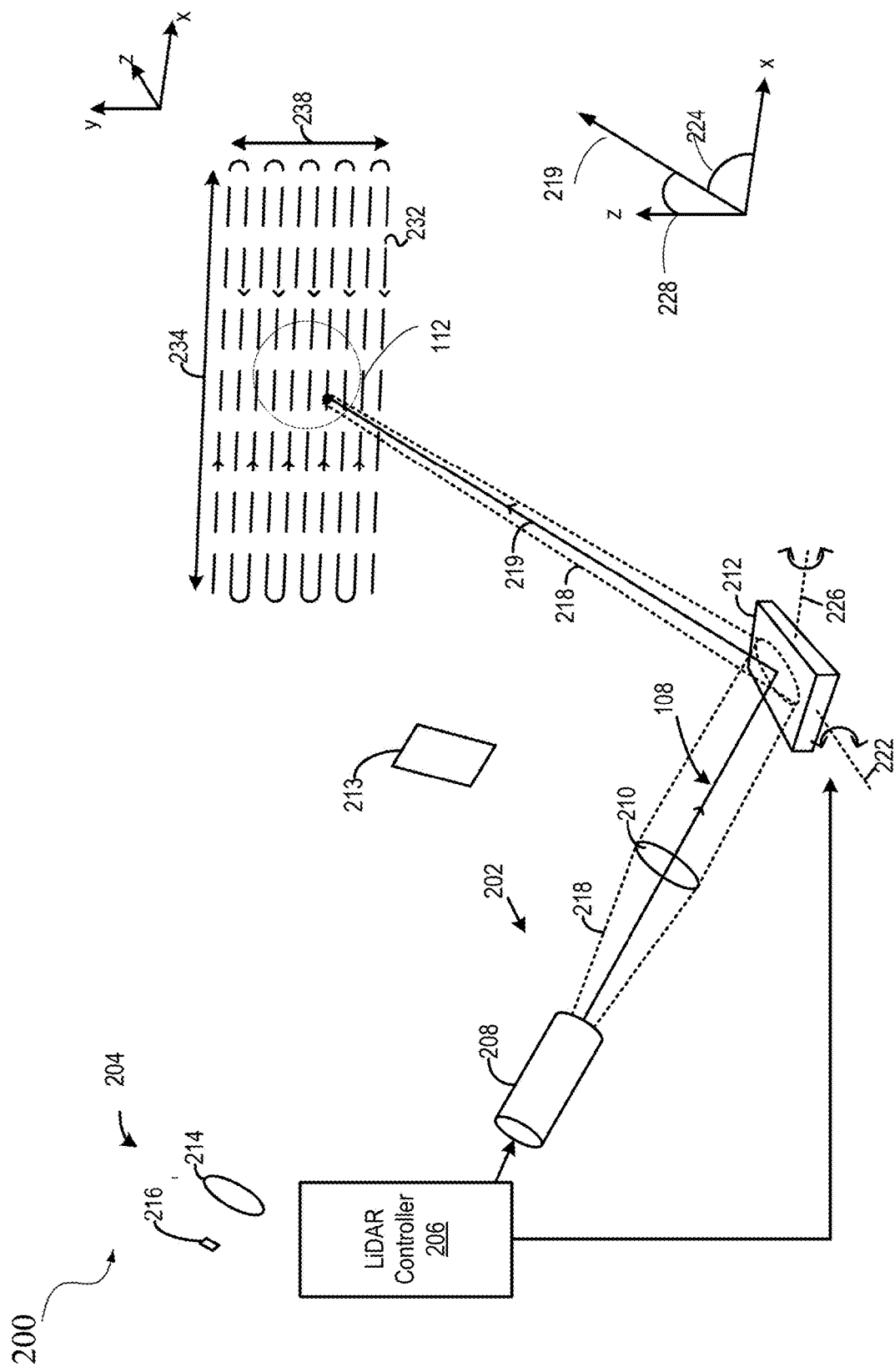
FIG. 2A shows an example of a light projection operation, according to certain embodiments.
Figure 2B:
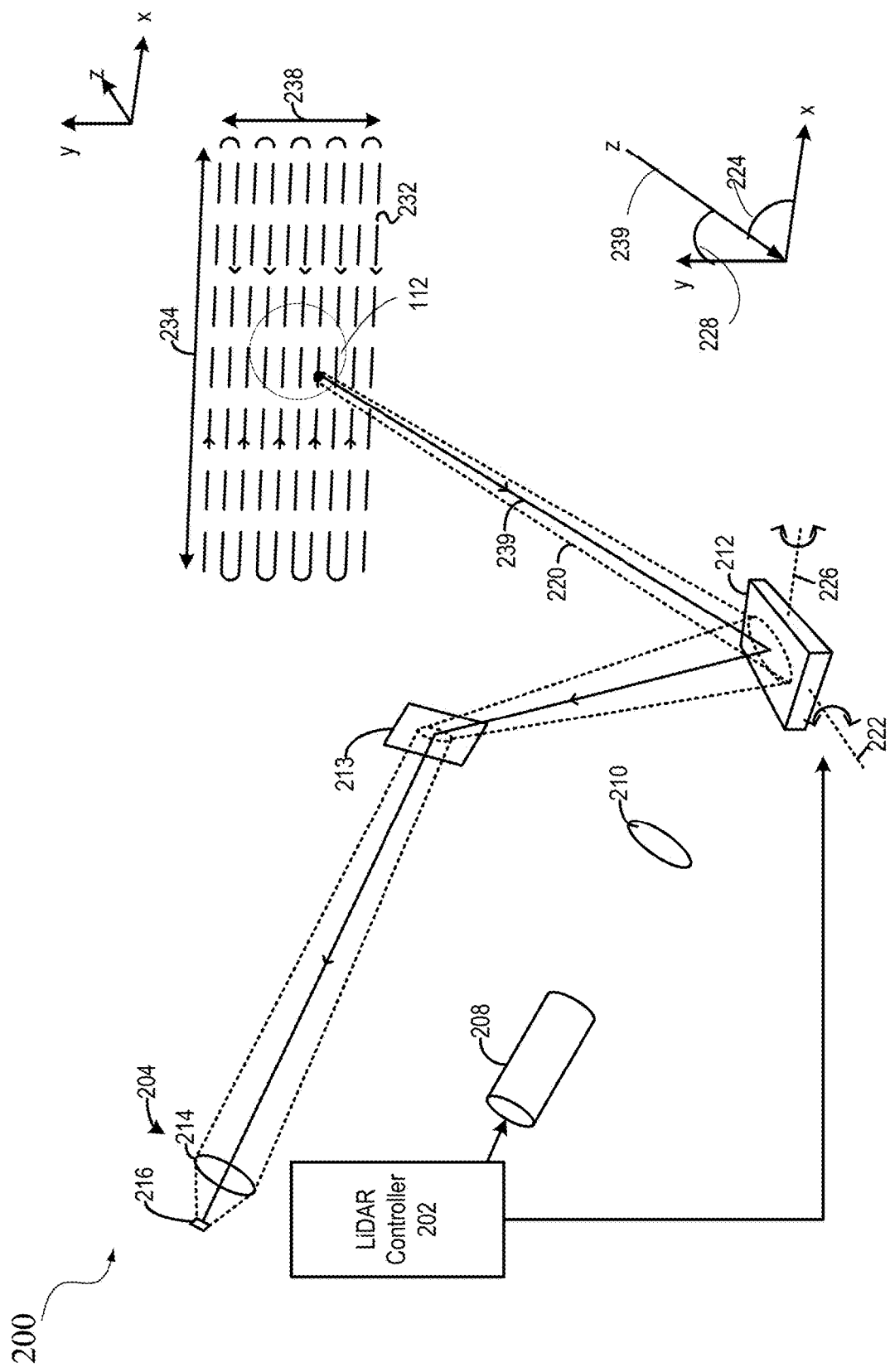
FIG. 2B shows an example of a light detection operation, according to certain embodiments.

FIG. 2A and FIG. 2B illustrate simplified block diagrams of an example of a LiDAR module 200 according to certain embodiments. LiDAR module 200 may be an example of LiDAR system 102, and may include a transmitter 202, a receiver 204, and LiDAR controller 206, which may be configured to control the operations of transmitter 202 and receiver 204. Transmitter 202 may include a light source 208 and a collimator lens 210, and receiver 204 can include a lens 214 and a photodetector 216. LiDAR module 200 may further include a mirror assembly 212 (also referred to as a "mirror structure") and a beam splitter 213. In some embodiments, LiDAR module 102, transmitter 202 and receiver 204 can be configured as a coaxial system to share mirror assembly 212 to perform light steering operations, with beam splitter 213 configured to reflect incident light reflected by mirror assembly 212 to receiver 204.

FIG. 2A shows an example of a light projection operation, according to certain embodiments. To project light, LiDAR controller 206 can control light source 208 (e.g., a pulsed laser diode, a source of FMCW signal, AMCW signal, etc.) to transmit light signal 108 as part of light beam 218. Light beam 218 can disperse upon leaving light source 208 and can be converted into collimated light beam 218 by collimator lens 210. Collimated light beam 218 can be incident upon a mirror assembly 212, which can reflect collimated light beam 218 to steer it along an output projection path 219 towards object 112. Mirror assembly 212 can include one or more rotatable mirrors. FIG. 2A illustrates mirror assembly 212 as having one mirror; however, a micro-mirror array may include multiple micro-mirror assemblies that can collectively provide the steering capability described herein. Mirror assembly 212 can further include one or more actuators (not shown in FIG. 2A) to rotate the rotatable mirrors. The actuators can rotate the rotatable mirrors around a first axis 222, and can rotate the rotatable mirrors along a second axis 226. The rotation around first axis 222 can change a first angle 224 of output projection path 219 with respect to a first dimension (e.g., the x-axis), whereas the rotation around second axis 226 can change a second angle 228 of output projection path 219 with respect to a second dimension (e.g., the z-axis). LiDAR controller 206 can control the actuators to produce different combinations of angles of rotation around first axis 222 and second axis 226 such that the movement of output projection path 219 can follow a scanning pattern 232. A range 234 of movement of output projection path 219 along the x-axis, as well as a range 238 of movement of output projection path 219 along the z-axis, can define a FOV. An object within the FOV, such as object 112, can receive and reflect collimated light beam 218 to form a reflected light signal, which can be received by receiver 204 and detected by the LiDAR module, as further described below with respect to FIG. 2B. In certain embodiments, mirror assembly 212 can include one or more comb spines with comb electrodes (see, e.g., FIG. 3), as will be described in further detail below.

FIG. 2B shows an example of a light detection operation, according to certain embodiments. LiDAR controller 206 can select an incident light direction 239 for detection of incident light by receiver 204. The selection can be based on setting the angles of rotation of the rotatable mirrors of mirror assembly 212, such that only light beam 220 propagating along light direction 239 gets reflected to beam splitter 213, which can then divert light beam 220 to photodetector 216 via collimator lens 214. With such arrangements, receiver 204 can selectively receive signals that are relevant for the ranging/imaging of object 112 (or any other object within the FOV), such as light signal 110 generated by the reflection of collimated light beam 218 by object 112, and not to receive other signals. As a result, the effect of environmental disturbance on the ranging and imaging of the object can be reduced, and the system performance may be improved.

Detachable MEMS Package Top Cover

A MEMS structure is a very complicated and precise component. Issues arise with performance after assembly, requiring debugging, repairing or replacing the structure in the package. This can be expensive and time-consuming. Also, the need to break the glue seal of the cover or lid can cause damage to the MEMS structure or the MEMS package. Another issue with gluing a glass lid on package is that precise alignment is difficult. Often, the glass lid will end up imperfectly centered on the package. Experience has shown that the offset of the glass lid can be as much as 1.5 mm and the direction of the offset is random and thus not predictable. This can lead to a malfunction of an MEMS package soldering jib on a Printed Circuit Board Assembly (PCBA).

FIG. 3 illustrates a MEMS chip package with a removable cover according to embodiments of the invention. A MEMS package body 302 has a removable metal cover 304 with a central glass pane 306. Cover 304 is held in place by a number of tabs or clamps such as 308, 310 and 312. The package leads 314 protrude from the bottom of the package.

FIGS. 4A-4B illustrate the top cover and package body of the MEMS chip package of FIG. 3 according to embodiments of the invention. FIG. 4A shows the underside of the cover 304 with glass pane 306 of FIG. 3. The glass pane 306 is a protective cover, transparent in the operational wavelength. In one embodiment, it is attached to the metal cover either through hermetic epoxy, or gold-tin soldering with a preform soldering layer on the glass. A gasket 404 is affixed to the inside perimeter of cover 304. The gasket can be a silicon rubber O-ring or other type of gasket that can both form a seal and be partially compressed under pressure. Gasket 404 can be affixed to cover 304 using an overmolding process with an epoxy or glue. Alternately, a slot (not shown) can be provided in the underside of cover 304, and gasket 404 can be press-fitted into the slot, so that no glue or epoxy is required.

FIG. 4B shows the package 302 without the cover. As can be seen, there is a slot 402 around the perimeter on the top of the walls of the package. Slot 402 is sized to receive gasket 404. By using a curved or rounded slot, with a correspondingly shaped gasket, less material needs to be removed from the top of the thin wall of the MEMS package, which means less weakening of the top of the wall. When cover 304 is placed on package 302, gasket 404 forms a seal in slot 402 when it is compressed to engage the clamps or tabs such as tabs 308 and 310. The tabs shown are pushed slightly backwards when the cover is pressed onto the package, and snap back when the gasket is compressed sufficiently to allow the top surface of the cover to be below the lips 408 and 410 of the tabs. The cover is placed on the package in a vacuum or an atmosphere of an inert gas (e.g., nitrogen or helium) so that the MEMS structure is hermetically sealed under the cover in the vacuum or inert gas.

FIG. 5 is a cut-away view of the MEMS chip package of FIG. 3 according to embodiments of the invention. As can be seen, the gasket 404 fits snugly into slot 402. In addition to the slot, just above the slot is an indentation 502 in tab 308 to receive the edge of cover 304. Similar indentations are on the other tabs. Thus, when cover 304 is pressed down past the lips of the tabs (such as lip 408) it will snap into recess 502 and the other recesses. With the pressure applied to the top of cover 304 by the lips 408 of the tabs, the cover is held securely in place and pressure is applied to gasket 404, compressing it into slot 402, forming a hermetic seal. This seal maintains the gas inside of package 302, such as nitrogen or helium, while at the same time keeping any moisture outside.

Inside of package 302 is the MEMS structure, which can be a variety of structures. In one embodiment, element 504 is a MEMS anchor, with torsion bars supporting a pivotable MEMS mirror structure 510. The MEMS mirror is supported by a supporting mechanical bracket 506, with a backside PCB 508 for the electronics of the package 302. Other MEMS structures could be placed inside of a MEMS package, such as a photodetector structure or a laser diode structure or a different mirror or other optics structure.

The MEMS chip package can be any type of package, such as a CNC (Computer Numerical Control machining— normally turning or milling) or forged package. In one embodiment, the main body of the MEMS package includes four snap fits at the top, which enable the top cover to be installed and uninstalled from the package. The snaps are molded integrally with the MEMS package walls in one embodiment. Alternately, they can be glued or otherwise attached to the MEMS package walls. The mechanical retention force resulting from such snap fits makes the top cover, together with the metal and glass cover, stay in place without the assistance of glue. The top cover is restrained by these four snap fits. The top cover can be lifted and retracted from the package by overcoming the snap fit retention force.

Furthermore, when the metal and glass cover is in the place, there will be no or minimal offset even without the assistance of additional tools or jigs. The snap fits limit the movement of the cover. Thus, the alignment of the cover is improved over gluing the cover on the MEMS package.

In order to seal the gap between the top cover and package body, a loop slot is cut into the top face of the package main body walls as described. The rubber gasket is overmolded on the bottom face of the top cover. After the top cover is placed on the package, the rubber gasket is fully seated in the slot and then the whole closed package assembly is dust free and hermetically sealed.

Other embodiments of the structure of a removable cover for a MEMS chip package could be used. For example, more than four clamps could be used. Alternately, one side of the cover and package may have no clamp, allowing the cover to be slid in and easily slid out without contacting a clamp. Alternately, the clamp itself on one or more sides can pivot forward and back to allow easy removal of the package cover for inspection. Alternately, different types of clamps may be used.

Although the gasket is shown glued to the inside of the top cover as an efficient way to assemble the package, other designs could be used. For example, the gasket could be attached to the top walls of the MEMS package, with the slot being in the cover, in an inverse structure. In another embodiment, the gasket can be flat, rather than rounded, and the slot might be eliminated. Alternately, a flat gasket could have a central ridge (T-shaped) that engages a narrow slot in the top walls of the MEMS package. In another embodiment, ridges are provided on the top and bottom of a flat gasket, engaging slots in both the top walls of the MEMS package and the underside of the cover. Alternately, the rubber gasket can have a slot along its inside edge for holding the metal and glass cover, such that it wraps around the outside perimeter of the cover, rather than being attached to the bottom of the cover.

In one embodiment, the slot is in the gasket, with the slot in the gasket engaging the top walls of the package, so that the gasket partially extends down both the inside and outside of the package walls. In yet another embodiment, the top cover is itself the gasket, with a rubber or other elastomeric material replacing the metal cover, and having the glass pane in the middle of the rubber gasket.

In yet another alternate embodiment, the cover could be glued to the MEMS package, with the glass pane being held in place by clamps either affixed to the cover, or affixed to the MEMS package and extending sufficiently far over the edges of the cover to contact the glass pane. For example, the perimeter of the cover around the glass pane can be made sufficiently narrow to allow such a structure.

Other types of clamping structures could be used as well. For example, the clamps can be part of the cover, engaging a recess in the side with MEMS package to attach the cover to the MEMS package.

In one embodiment, cover 304 is metal, such as aluminum. The gasket is a rubber material in one embodiment which will not react with the nitrogen, helium, or other gas inside the MEMS package. Alternately, other elastic and compressible materials could be used, such as silicone.

As can be seen, embodiments of the present invention eliminate the need for using an epoxy or glue to hold a cover on a MEMS package. Accordingly, this makes reopening the package for testing and diagnosis a much cleaner and simpler operation, without the need to break open the glue with the risk of particles contaminating the interior or breaking components due to the forces required. Additionally, the cover, gasket and slot of the package can be machined precisely so that the cover and its glass pane are fixed to the package without any tilting. In contrast, the use of an epoxy or glue risks having the glue or epoxy compressed different amounts or being of different thicknesses at different points around the MEMS package, causing the cover to be uneven. An uneven cover can cause the glass pane to be at an angle, affecting the ingress or egress of light. In other embodiments, the glass pane could be a lens, and as such its alignment is critical to the proper operation of the MEMS optical structure.

The packaging mechanism of embodiments of the invention is compatible with the drying, moisture removal, or N2/He backfilling processes used to assemble a sealed package. The package is also compatible with standard air conditioning features. In one embodiment, the cover is assembled over the MEMS package within a glove box with pressure control. There is an oven or hotplate inside the glove box. The package and cover are placed within the glove box before the assembly process begins. A thermal treatment is used to remove the moisture inside the package. With connected N2/He air tanks, the glove box can exchange the air composition in it, and therefore control the air packaged inside the package.

A glove box is a sealed container that allows one to manipulate objects where a separate atmosphere is desired. Built into the sides of the glove box are gloves that the user can use to perform tasks inside the glove box without breaking containment. The box is transparent to allow the user to see what is being manipulated. The glove boxes allow a person to manipulate the cover and MEMS package to assemble them in an inert air atmosphere, such as helium, argon or nitrogen. It is also possible to use the glove box for assembly in a vacuum chamber.

The gas in a glove box is pumped through a series of treatment devices which remove solvents, water and oxygen from the gas. Heated copper metal (or some other finely divided metal) can be used to remove oxygen. An oxygen removal column is regenerated by passing a hydrogen/nitrogen mixture through it while it is heated. Water formed is passed out of the glove box with the excess hydrogen and nitrogen. Molecular sieves can remove water by absorbing it in the pores of the molecular sieves. The inert atmosphere gloveboxes are kept at a higher pressure than the surrounding air, so that any microscopic leaks are mostly leaking inert gas out of the box instead of letting air in.

The glove box is just one embodiment of a structure and process for assembling. Other structures and processes can be used. In one alternative example, Schlenk methods are employed using a Schlenk line. The Schlenk line (also vacuum gas manifold) is a chemistry apparatus developed by Wilhelm Schlenk. It has a dual manifold with several ports. One manifold connects to a source of purified inert gas, while the other connects to a vacuum pump.

Figure 6:
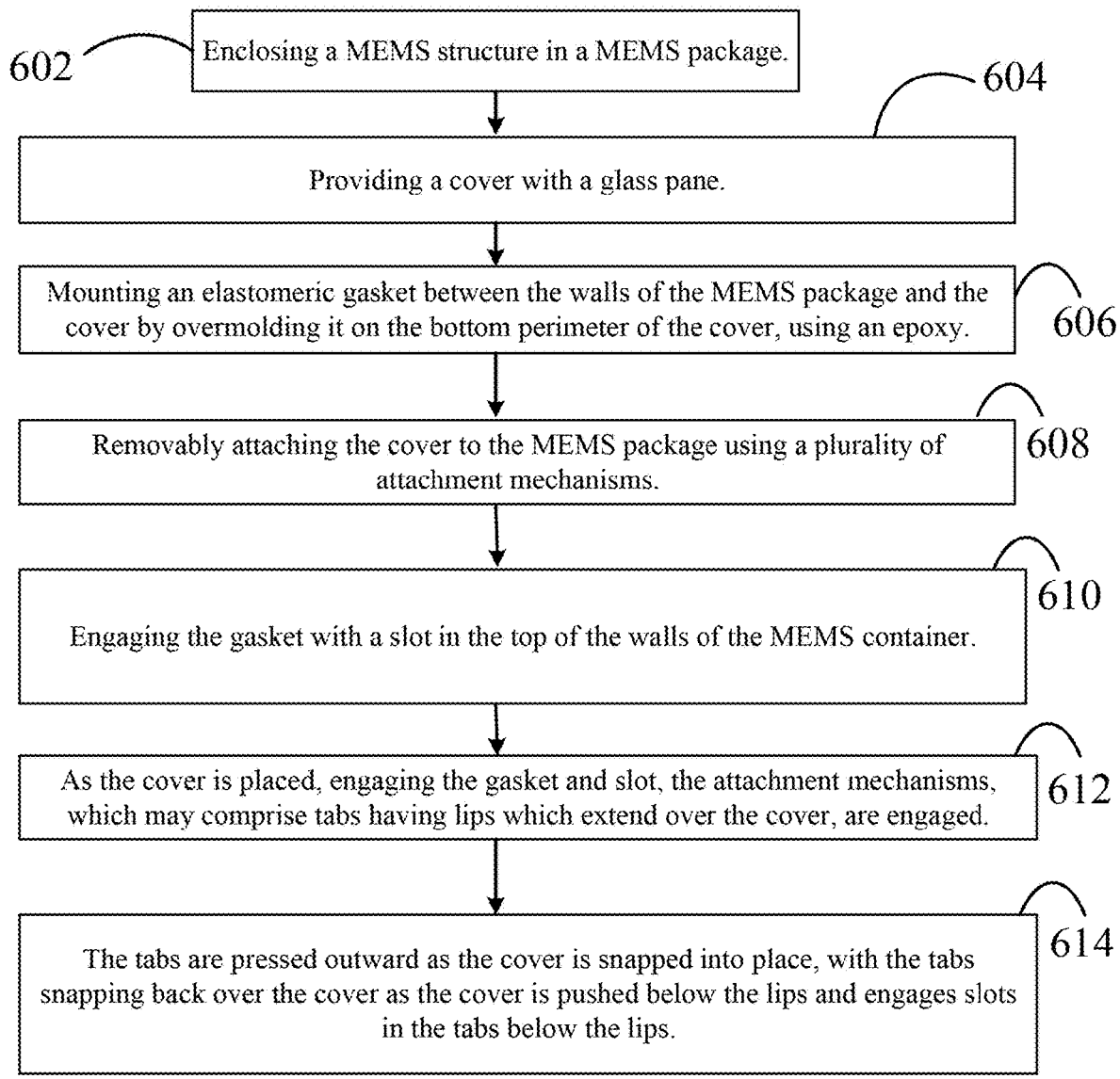
FIG. 6 is a flow chart for the assembly of the MEMS chip package of FIG. 3 according to embodiments of the invention.

FIG. 6 is a flow chart for the assembly of the MEMS chip package of FIG. 3 according to embodiments of the invention. Step 602 is enclosing a MEMS structure in a MEMS package, the MEMS package having a bottom and walls. Step 604 is providing a cover with a glass pane. Step 606 is mounting an elastomeric gasket between the walls of the MEMS package and the cover by overmolding it on the bottom perimeter of the cover, using an epoxy. Next, in step 608, is removably attaching the cover to the MEMS package using a plurality of attachment mechanisms.

In one embodiment, this attaching is done in a further step 610 by engaging the gasket with a slot in the top of the walls of the MEMS container. As the cover is placed, engaging the gasket and slot, the attachment mechanisms, which may comprise tabs having lips which extend over the cover, are engaged (step 612). The tabs are pressed outward as the cover is snapped into place, with the tabs snapping back over the cover as the cover is pushed below the lips and engages slots in the tabs below the lips (step 614).

Figure 7:
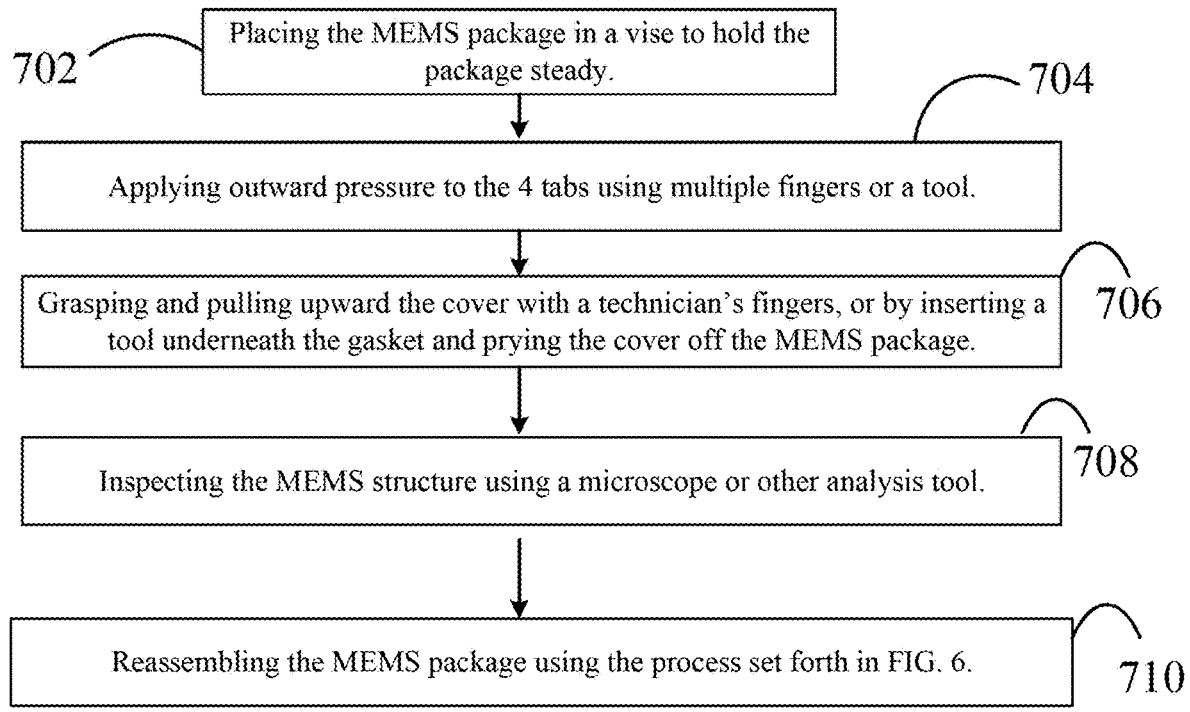
FIG. 7 is a flow chart for the disassembly of the MEMS chip package of FIG. 3 according to embodiments of the invention.

FIG. 7 is a flow chart for the disassembly of the MEMS chip package of FIG. 3 according to embodiments of the invention. Step 702 is placing the MEMS package in a vise to hold the package steady. Step 704 is applying outward pressure to some or all of the 4 tabs using multiple fingers or a tool. The press fit features can include chamfer guides around the bottom of the cover, so that one or two tabs loose would be sufficient. Step 706 is grasping and pulling upward the cover with a technician's fingers, or by inserting a tool underneath the gasket and prying the cover off the MEMS package. The MEMS structure is then inspected using a microscope or other analysis tool (step 708). After inspection, the MEMS package can be reassembled using the process set forth in FIG. 6 (step 710).

Example LiDAR System Implementing Aspects of Embodiments Herein

Figure 8:
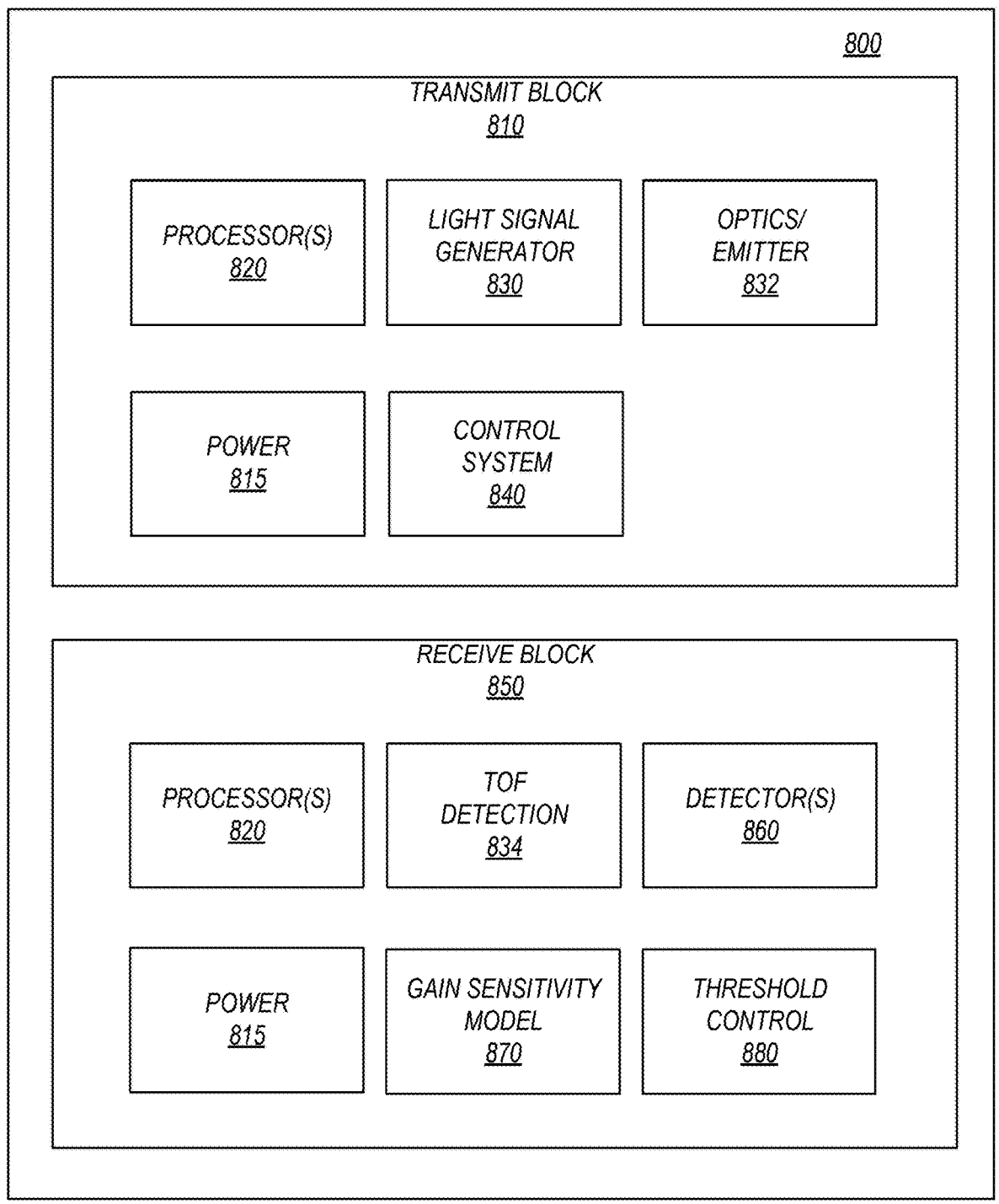
FIG. 8 illustrates a simplified block diagram showing aspects of a LiDAR-based detection system incorporating the MEMS chip package with a removable cover described above, according to certain embodiments.

FIG. 8 illustrates a simplified block diagram showing aspects of a LiDAR-based detection system incorporating the MEMS chip package with a removable cover described above, according to certain embodiments. The MEMS package with the removable cover can be monitored or tested in such a system, using monitoring/testing software. System 800 may be configured to transmit, detect, and process LiDAR signals to perform object detection as described above with regard to LiDAR system 800 described in FIG. 1. In general, a LiDAR system 800 includes one or more transmitters (e.g., transmit block 810) and one or more receivers (e.g., receive block 850). LiDAR system 800 may further include additional systems that are not shown or described to prevent obfuscation of the novel features described herein.

Transmit block 810, as described above, can incorporate a number of systems that facilitate the generation and emission of a light signal, including dispersion patterns (e.g., 360 degree planar detection), pulse shaping and frequency control, Time-Of-Flight (TOF) measurements, and any other control systems to enable the LiDAR system to emit pulses in the manner described above. In the simplified representation of FIG. 8, transmit block 810 can include processor(s) 820, light signal generator 830, optics/emitter module 832, power block 815 and control system 840. Some or all of system blocks 830-840 can be in electrical communication with processor(s) 820.

In certain embodiments, processor(s) 820 may include one or more microprocessors (μCs) and can be configured to control the operation of system 800. Alternatively or additionally, processor 820 may include one or more microcontrollers (MCUs), digital signal processors (DSPs), or the like, with supporting hardware, firmware (e.g., memory, programmable I/Os, etc.), and/or software, as would be appreciated by one of ordinary skill in the art. Software monitoring or testing programs can be included in such memories, to determine if the removable cover needs to be removed to allow inspection of the MEMS structure. Alternatively, MCUs, μCs, DSPs, ASICs, programmable logic devices, and the like, may be configured in other system blocks of system 800. For example, control system block 840 may include a local processor to certain control parameters (e.g., operation of the emitter). Processor(s) 820 may control some or all aspects of transmit block 810 (e.g., optics/emitter 832, control system 840, dual sided mirror 220 position as shown in FIG. 1, position sensitive device 250, etc.), receive block 850 (e.g., processor(s) 820) or any aspects of LiDAR system 800. Processor(s) 820 also determine, from a detected laser wavelength, the wavelength band to provide to the WSS in one embodiment. In some embodiments, multiple processors may enable increased performance characteristics in system 800 (e.g., speed and bandwidth); however, multiple processors are not required, nor necessarily germane to the novelty of the embodiments described herein. Alternatively or additionally, certain aspects of processing can be performed by analog electronic design, as would be understood by one of ordinary skill in the art.

Light signal generator 830 may include circuitry (e.g., a laser diode) configured to generate a light signal, which can be used as the LiDAR send signal, according to certain embodiments. In some cases, light signal generator 830 may generate a laser that is used to generate a continuous or pulsed laser beam at any suitable electromagnetic wavelengths spanning the visible light spectrum and non-visible light spectrum (e.g., ultraviolet and infra-red). In some embodiments, lasers are commonly in the range of 600-1200 nm, although other wavelengths are possible, as would be appreciated by one of ordinary skill in the art.

Optics/Emitter block 832 (also referred to as transmitter 832) may include one or more arrays of mirrors (including but not limited to dual sided mirror 220 as described above in FIGS. 1-6) for redirecting and/or aiming the emitted laser pulse, mechanical structures to control spinning and/or moving of the emitter system, or other system to affect the system field-of-view, as would be appreciated by one of ordinary skill in the art with the benefit of this disclosure. For instance, some systems may incorporate a beam expander (e.g., convex lens system) in the emitter block that can help reduce beam divergence and increase the beam diameter. These improved performance characteristics may mitigate background return scatter that may add noise to the return signal. In some cases, optics/emitter block 832 may include a beam splitter to divert and sample a portion of the pulsed signal. For instance, the sampled signal may be used to initiate the TOF clock. In some cases, the sample can be used as a reference to compare with backscatter signals. Some embodiments may employ micro electromechanical mirrors (MEMS) that can reorient light to a target field. Alternatively or additionally, multi-phased arrays of lasers may be used. Any suitable system may be used to emit the LiDAR send pulses, as would be appreciated by one of ordinary skill in the art.

Power block 815 can be configured to generate power for transmit block 810, receive block 850, as well as manage power distribution, charging, power efficiency, and the like. In some embodiments, power management block 815 can include a battery (not shown), and a power grid within system 800 to provide power to each subsystem (e.g., control system 840, etc.). The functions provided by power management block 815 may be subsumed by other elements within transmit block 810, or may provide power to any system in LiDAR system 800. Alternatively, some embodiments may not include a dedicated power block and power may be supplied by a number of individual sources that may be independent of one another.

Control system 840 may control aspects of light signal generation (e.g., pulse shaping), optics/emitter control, TOF timing, or any other function described herein. In some cases, aspects of control system 840 may be subsumed by processor(s) 820, light signal generator 830, or any block within transmit block 810, or LiDAR system 800 in general.

Receive block 850 may include circuitry configured to detect and process a return light pulse to determine a distance of an object, and in some cases determine the dimensions of the object, the velocity and/or acceleration of the object, and the like. This block includes the WSS describe above. Processor(s) 1065 may be configured to perform operations such as processing received return pulses from detectors(s) 860, controlling the operation of TOF module 834, controlling threshold control module 880, or any other aspect of the functions of receive block 850 or LiDAR system 800 in general. Processor(s) 1065 also control the mirror array, or transmissive array, in the WSS as described above.

TOF module 834 may include a counter for measuring the time-of-flight of a round trip for a send and return signal. In some cases, TOF module 834 may be subsumed by other modules in LiDAR system 800, such as control system 840, optics/emitter 832, or other entity. TOF modules 834 may implement return "windows" that limit a time that LiDAR system 800 looks for a particular pulse to be returned. For example, a return window may be limited to a maximum amount of time it would take a pulse to return from a maximum range location (e.g., 250 m). Some embodiments may incorporate a buffer time (e.g., maximum time plus 10%). TOF module 834 may operate independently or may be controlled by other system block, such as processor(s) 820, as described above. In some embodiments, transmit block may also include a TOF detection module. One of ordinary skill in the art with the benefit of this disclosure would appreciate the many modification, variations, and alternative ways of implementing the TOF detection block in system 800.

Detector(s) 860 may detect incoming return signals that have reflected off of one or more objects. In some cases, LiDAR system 800 may employ spectral filtering based on wavelength, polarization, and/or range to help reduce interference, or filter unwanted frequencies, or other deleterious signals that may be detected. Typically, detector(s) 860 can detect an intensity of light and records data about the return signal (e.g., via coherent detection, photon counting, analog signal detection, or the like). Detector (s) 860 can use any suitable photodetector technology including solid state photodetectors (e.g., silicon avalanche photodiodes, complimentary metal-oxide semiconductors (CMOS), charge-coupled devices (CCD), hybrid CMOS/CCD devices) or photomultipliers. In some cases, a single receiver may be used or multiple receivers may be configured to operate in parallel.

Gain sensitivity model 870 may include systems and/or algorithms for determining a gain sensitivity profile that can be adapted to a particular object detection threshold. The gain sensitivity profile can be modified based on a distance (range value) of a detected object (e.g., based on TOF measurements). In some cases, the gain profile may cause an object detection threshold to change at a rate that is inversely proportional with respect to a magnitude of the object range value. A gain sensitivity profile may be generated by hardware/software/firmware, or gain sensor model 870 may employ one or more look-up tables (e.g., stored in a local or remote database) that can associate a gain value with a particular detected distance or associate an appropriate mathematical relationship therebetween (e.g., apply a particular gain at a detected object distance that is 10% of a maximum range of the LiDAR system, apply a different gain at 15% of the maximum range, etc.). In some cases, a Lambertian model may be used to apply a gain sensitivity profile to an object detection threshold. The Lambertian model typically represents perfectly diffuse (matte) surfaces by a constant bidirectional reflectance distribution function (BRDF), which provides reliable results in a LiDAR system as described herein. However, any suitable gain sensitivity profile can be used including, but not limited to, Oren-Nayar model, Nanrahan-Krueger model, Cook-Torrence model, Diffuse BRDF model, Limmel-Seeliger model, Blinn-Phong model, Ward model, HTSG model, Fitted Lafortune model, or the like. One of ordinary skill in the art with the benefit of this disclosure would understand the many alternatives, modifications, and applications thereof.

Threshold control block 880 may set an object detection threshold for LiDAR system 800. For example, threshold control block 880 may set an object detection threshold over a full range of detection for LiDAR system 800. The object detection threshold may be determined based on a number of factors including, but not limited to, noise data (e.g., detected by one or more microphones) corresponding to an ambient noise level, and false positive data (typically a constant value) corresponding to a rate of false positive object detection occurrences for the LiDAR system. In some embodiments, the object detection threshold may be applied to the maximum range (furthest detectable distance) with the object detection threshold for distances ranging from the minimum detection range up to the maximum range being modified by a gain sensitivity model (e.g., Lambertian model).

Although certain systems may not be expressly discussed, they should be considered as part of system 800, as would be understood by one of ordinary skill in the art. For example, system 800 may include a bus system (e.g., CAMBUS) to transfer power and/or data to and from the different systems therein. In some embodiments, system 800 may include a storage subsystem (not shown). A storage subsystem can store one or more software programs to be executed by processors (e.g., in processor(s) 820). It should be understood that "software" can refer to sequences of instructions that, when executed by processing unit(s) (e.g., processors, processing devices, etc.), cause system 800 to perform certain operations of software programs. The instructions can be stored as firmware residing in read only memory (ROM) and/or applications stored in media storage that can be read into memory for processing by processing devices. Software can be implemented as a single program or a collection of separate programs and can be stored in non-volatile storage and copied in whole or in-part to volatile working memory during program execution. From a storage subsystem, processing devices can retrieve program instructions to execute in order to execute various operations (e.g., software-controlled spring auto-adjustment, etc.) as described herein. Some software controlled aspects of LiDAR system 800 may include aspects of gain sensitivity model 870, threshold control 880, control system 840, TOF module 834, or any other aspect of LiDAR system 800.

It should be appreciated that system 800 is meant to be illustrative and that many variations and modifications are possible, as would be appreciated by one of ordinary skill in the art. System 800 can include other functions or capabilities that are not specifically described here. For example, LiDAR system 800 may include a communications block (not shown) configured to enable communication between LiDAR system 800 and other systems of the vehicle or remote resource (e.g., remote servers), etc., according to certain embodiments. In such cases, the communications block can be configured to provide wireless connectivity in any suitable communication protocol (e.g., radio-frequency (RF), Bluetooth, BLE, infra-red (IR), ZigBee, Z-Wave, Wi-Fi, or a combination thereof).

While system 800 is described with reference to particular blocks (e.g., threshold control block 880), it is to be understood that these blocks are defined for understanding certain embodiments of the invention and is not intended to imply that embodiments are limited to a particular physical arrangement of component parts. The individual blocks need not correspond to physically distinct components. Blocks can be configured to perform various operations, e.g., by programming a processor or providing appropriate processes, and various blocks may or may not be reconfigurable depending on how the initial configuration is obtained. Certain embodiments can be realized in a variety of apparatuses including electronic devices implemented using any combination of circuitry and software. Furthermore, aspects and/or portions of system 800 may be combined with or operated by other sub-systems as informed by design. For example, power management block 815 and/or threshold control block 880 may be integrated with processor(s) 820 instead of functioning as separate entities.

Example Computer Systems Implementing Aspects of Embodiments Herein

Figure 9:
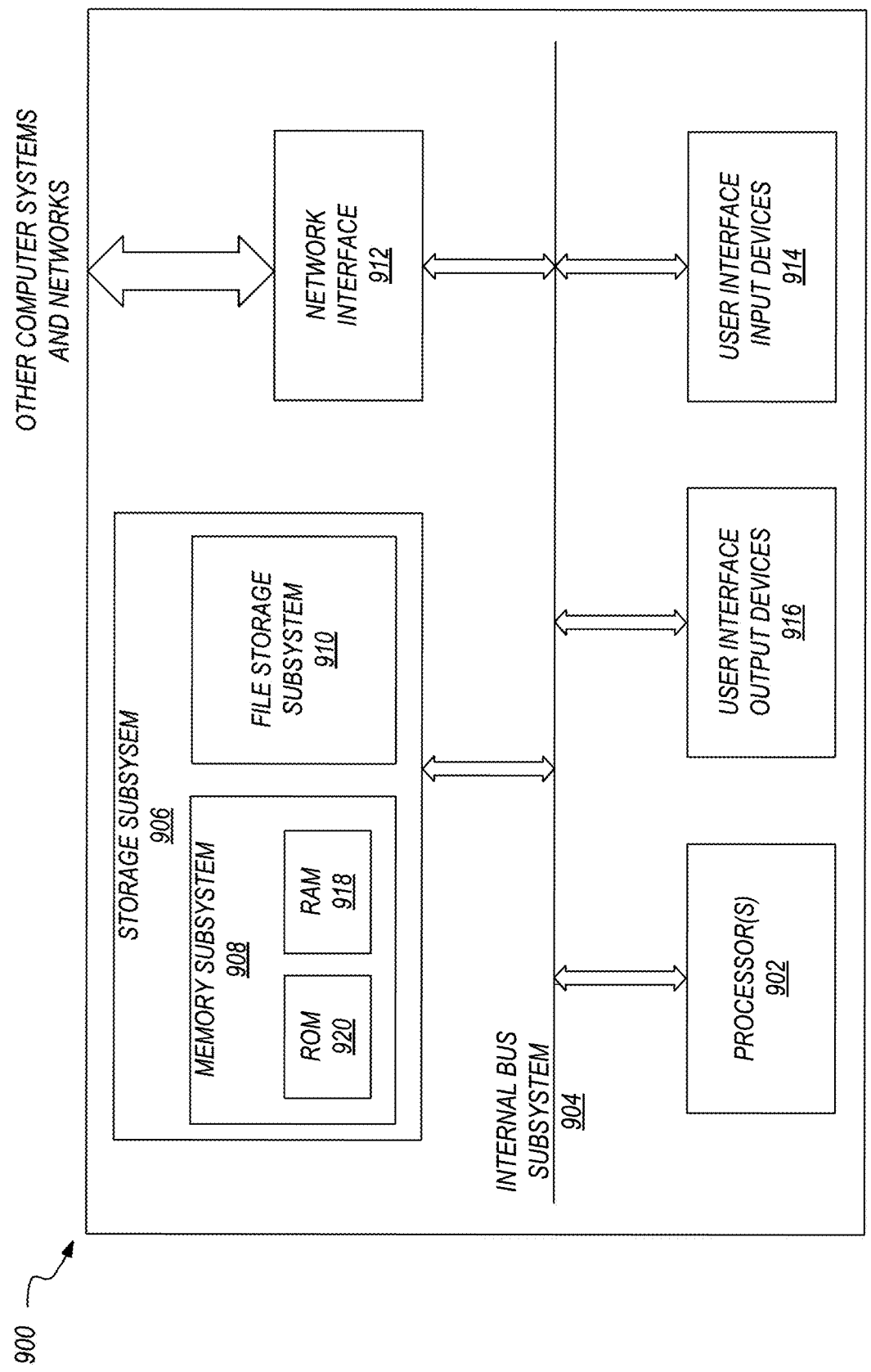
FIG. 9 is a simplified block diagram of computer system 900 configured to operate aspects of a LiDAR-based detection system, according to certain embodiments.

FIG. 9 is a simplified block diagram of computer system 900 configured to operate aspects of a LiDAR-based detection system, according to certain embodiments. Computer system 900 can be used to implement any of the systems and modules discussed above with respect to FIGS. 1-6. For example, computer system 900 may operate aspects of threshold control 880, TOF module 834, processor(s) 820, control system 840, or any other element of LiDAR system 800 or other system described herein. Computer system 900 can include one or more processors 902 that can communicate with a number of peripheral devices (e.g., input devices) via a bus subsystem 904. These peripheral devices can include storage subsystem 906 (comprising memory subsystem 908 and file storage subsystem 910), user interface input devices 914, user interface output devices 916, and a network interface subsystem 912.

In some examples, internal bus subsystem 904 (e.g., CAMBUS) can provide a mechanism for letting the various components and subsystems of computer system 900 communicate with each other as intended. Although internal bus subsystem 904 is shown schematically as a single bus, alternative embodiments of the bus subsystem can utilize multiple buses. Additionally, network interface subsystem 912 can serve as an interface for communicating data between computer system 900 and other computer systems or networks. Embodiments of network interface subsystem 912 can include wired interfaces (e.g., Ethernet, CAN, RS232, RS485, etc.) or wireless interfaces (e.g., ZigBee, Wi-Fi, cellular, etc.).

In some cases, user interface input devices 914 can include a keyboard, pointing devices (e.g., mouse, trackball, touchpad, etc.), a barcode scanner, a touch-screen incorporated into a display, audio input devices (e.g., voice recognition systems, microphones, etc.), Human Machine Interfaces (HMI) and other types of input devices. In general, use of the term "input device" is intended to include all possible types of devices and mechanisms for inputting information into computer system 900. Additionally, user interface output devices 916 can include a display subsystem, a printer, or non-visual displays such as audio output devices, etc. The display subsystem can be any known type of display device. In general, use of the term "output device" is intended to include all possible types of devices and mechanisms for outputting information from computer system 900.

Storage subsystem 906 can include memory subsystem 908 and file/disk storage subsystem 910. Subsystems 908 and 910 represent non-transitory computer-readable storage media that can store program code and/or data that provide the functionality of embodiments of the present disclosure. In some embodiments, memory subsystem 908 can include a number of memories including main random access memory (RAM) 918 for storage of instructions and data during program execution and read-only memory (ROM) 920 in which fixed instructions may be stored. File storage subsystem 910 can provide persistent (i.e., non-volatile) storage for program and data files, and can include a magnetic or solid-state hard disk drive, an optical drive along with associated removable media (e.g., CD-ROM, DVD, Blu-Ray, etc.), a removable flash memory-based drive or card, and/or other types of storage media known in the art. The memory system can contain a program for monitoring or testing the MEMS structures, and storing the data corresponding to the monitored conditions or test results. That data can be consulted when examining the MEMS structure after removing the removable cover.

It should be appreciated that computer system 900 is illustrative and not intended to limit embodiments of the present disclosure. Many other configurations having more or fewer components than system 900 are possible.

The various embodiments further can be implemented in a wide variety of operating environments, which in some cases can include one or more user computers, computing devices or processing devices, which can be used to operate any of a number of applications. User or client devices can include any of a number of general purpose personal computers, such as desktop or laptop computers running a standard operating system, as well as cellular, wireless and handheld devices running mobile software and capable of supporting a number of networking and messaging protocols. Such a system also can include a number of workstations running any of a variety of commercially available operating systems and other known applications for purposes such as development and database management. These devices also can include other electronic devices, such as dummy terminals, thin-clients, gaming systems and other devices capable of communicating via a network.

Most embodiments utilize at least one network that would be familiar to those skilled in the art for supporting communications using any of a variety of commercially available protocols, such as TCP/IP, UDP, OSI, FTP, UPnP, NFS, CIFS, and the like. The network can be, for example, a local-area network, a wide-area network, a virtual private network, the Internet, an intranet, an extranet, a public switched telephone network, an infrared network, a wireless network, and any combination thereof.

In embodiments utilizing a network server, the network server can run any of a variety of server or mid-tier applications, including HTTP servers, FTP servers, CGI servers, data servers, Java servers, and business application servers. The server(s) also may be capable of executing programs or scripts in response to requests from user devices, such as by executing one or more applications that may be implemented as one or more scripts or programs written in any programming language, including but not limited to Java®, C, C# or C++, or any scripting language, such as Perl, Python or TCL, as well as combinations thereof. The server(s) may also include database servers, including without limitation those commercially available from Oracle®, Microsoft®, Sybase®, and IBM®.

The environment can include a variety of data stores and other memory and storage media as discussed above. These can reside in a variety of locations, such as on a storage medium local to (and/or resident in) one or more of the computers or remote from any or all of the computers across the network. In a particular set of embodiments, the information may reside in a storage-area network (SAN) familiar to those skilled in the art. Similarly, any necessary files for performing the functions attributed to the computers, servers or other network devices may be stored locally and/or remotely, as appropriate. Where a system includes computerized devices, each such device can include hardware elements that may be electrically coupled via a bus, the elements including, for example, at least one central processing unit (CPU), at least one input device (e.g., a mouse, keyboard, controller, touch screen or keypad), and at least one output device (e.g., a display device, printer or speaker). Such a system may also include one or more storage devices, such as disk drives, optical storage devices, and solid-state storage devices such as RAM or ROM, as well as removable media devices, memory cards, flash cards, etc.

Such devices also can include a computer-readable storage media reader, a communications device (e.g., a modem, a network card (wireless or wired), an infrared communication device, etc.), and working memory as described above. The computer-readable storage media reader can be connected with, or configured to receive, a non-transitory computer readable storage medium, representing remote, local, fixed, and/or removable storage devices as well as storage media for temporarily and/or more permanently containing, storing, transmitting, and retrieving computer-readable information. The system and various devices also typically will include a number of software applications, modules, services or other elements located within at least one working memory device, including an operating system and application programs, such as a client application or browser. It should be appreciated that alternate embodiments may have numerous variations from that described above. For example, customized hardware might also be used and/or particular elements might be implemented in hardware, software (including portable software, such as applets) or both. Further, connection to other computing devices such as network input/output devices may be employed.

Non-transitory storage media and computer-readable storage media for containing code, or portions of code, can include any appropriate media known or used in the art such as, but not limited to, volatile and non-volatile, removable and non-removable media implemented in any method or technology for storage of information such as computer-readable instructions, data structures, program modules or other data, including RAM, ROM, Electrically Erasable Programmable Read-Only Memory (EEPROM), flash memory or other memory technology, CD-ROM, DVD or other optical storage, magnetic cassettes, magnetic tape, magnetic disk storage or other magnetic storage devices or any other medium which can be used to store the desired information and which can be accessed by a system device. Based on the disclosure and teachings provided herein, a person of ordinary skill in the art will appreciate other ways and/or methods to implement the various embodiments. However, computer-readable storage media does not include transitory media such as carrier waves or the like.

Other variations are within the spirit of the present disclosure. Thus, while the disclosed techniques are susceptible to various modifications and alternative constructions, certain illustrated examples thereof are shown in the drawings and have been described above in detail. It should be understood, however, that there is no intention to limit the disclosure to the specific form or forms disclosed, but on the contrary, the intention is to cover all modifications, alternative constructions and equivalents falling within the spirit and scope of the disclosure, as defined in the appended claims. For instance, any of the examples, alternative examples, etc., and the concepts thereof may be applied to any other examples described and/or within the spirit and scope of the disclosure.

For example, instead of using tabs to hold the cover in place, clamps could be used. Alternately, tabs could be attached to the cover, and engage recesses in the walls of the MEMS package. A variety of other variations in the structure of the attachment mechanisms and the assembly of the cover on the MEMS package could be used.

The removable cover for the MEMS package of the present invention can be used in a variety of other applications than LIDAR. Light beam steering techniques can also be used in other optical systems, such as optical display systems (e.g., TVs), optical sensing systems, optical imaging systems, and the like.

The use of the terms "a" and "an" and "the" and similar referents in the context of describing the disclosed examples (especially in the context of the following claims) are to be construed to cover both the singular and the plural, unless otherwise indicated herein or clearly contradicted by context. The terms "comprising," "having," "including," and "containing" are to be construed as open-ended terms (i.e., meaning "including, but not limited to,") unless otherwise noted. The term "connected" is to be construed as partly or wholly contained within, attached to, or joined together, even if there is something intervening. The phrase "based on" should be understood to be open-ended, and not limiting in any way, and is intended to be interpreted or otherwise read as "based at least in part on," where appropriate. Recitation of ranges of values herein are merely intended to serve as a shorthand method of referring individually to each separate value falling within the range, unless otherwise indicated herein, and each separate value is incorporated into the specification as if it were individually recited herein. All methods described herein can be performed in any suitable order unless otherwise indicated herein or otherwise clearly contradicted by context. The use of any and all examples, or exemplary language (e.g., "such as") provided herein, is intended merely to better illuminate examples of the disclosure and does not pose a limitation on the scope of the disclosure unless otherwise claimed. No language in the specification should be construed as indicating any non-claimed element as essential to the practice of the disclosure.

What is claimed is:

1. A micro-electromechanical system (MEMS) apparatus for beam steering in a Light Detection and Ranging (LiDAR) system of an autonomous vehicle, the apparatus comprising:
   a laser diode emitting a laser beam;
   a photodetector positioned to detect a reflection of the laser beam;
   a MEMS mirror positioned to scan the laser beam across an environment;
   a MEMS package enclosing one of the laser diode, photodetector and MEMS mirror, the MEMS package comprising:
   a MEMS container having a bottom and four walls;
   a metal cover with a glass pane in a central portion of the metal cover;
   an elastomeric gasket attached to a bottom perimeter of the metal cover;
   a slot in the top of the four walls of the MEMS container, the slot having an inverse of the shape of the elastomeric gasket;
   a plurality of tabs attached to the walls of the MEMS container, each tab having a lip extending over the cover at a height requiring compression of the gasket to engage the cover under the lip, thereby maintaining downward pressure on the cover by the lips;
   wherein the tabs have a slot on an inward surface underneath the lips, engaging an edge of the cover to secure the cover in place, and a controller configured to control the MEMS mirror to scan the environment.

2. The apparatus of claim 1 further comprising:
   an inert gas sealed inside the MEMS container and metal cover.

3. The apparatus of claim 1 further comprising a glue or epoxy fastening the elastomeric gasket to the bottom perimeter of the metal cover.

4. The apparatus of claim 1 wherein the elastomeric gasket is rounded in cross-section, and the slot in the top of the four walls of the MEMS container has a rounded bottom.

5. An apparatus comprising:
   a MEMS structure;
   a MEMS package enclosing the MEMS structure, the MEMS package comprising:
   a MEMS container having a bottom and walls;
   a cover with a glass pane;
   an elastomeric gasket mounted between the walls of the MEMS container and the cover;
   a plurality of attachment mechanisms for removably attaching the cover to the MEMS container; and
   a slot in the top of the walls of the MEMS container shaped to engage the gasket.

6. The apparatus of claim 5 wherein the gasket has a curved cross-section, and the slot is curved to match the shape of the gasket.

7. An apparatus comprising:
   a MEMS structure;
   a MEMS package enclosing the MEMS structure, the MEMS package comprising:
   a MEMS container having a bottom and walls;
   a cover with a glass pane;
   an elastomeric gasket mounted between the walls of the MEMS container and the cover; and
   a plurality of attachment mechanisms for removably attaching the cover to the MEMS container;
   wherein the attachment mechanisms comprise tabs having lips which extend over the cover.

8. The apparatus of claim 7 wherein the tabs further include slots beneath the lips for engaging the cover.

9. The apparatus of claim 7 wherein the tabs are integrally formed with the MEMS container walls.

10. An apparatus comprising:
    a MEMS structure;
    a MEMS package enclosing the MEMS structure, the MEMS package comprising:
    a MEMS container having a bottom and walls;
    a cover with a glass pane;
    an elastomeric gasket mounted between the walls of the MEMS container and the cover; and
    a plurality of attachment mechanisms for removably attaching the cover to the MEMS container;
    wherein the elastomeric gasket is silicon rubber that is overmolded on the cover.

11. An apparatus comprising:
    a MEMS structure;
    a MEMS package enclosing the MEMS structure, the MEMS package comprising:
    a MEMS container having a bottom and walls;
    a cover with a glass pane;
    an elastomeric gasket mounted between the walls of the MEMS container and the cover;
    a plurality of attachment mechanisms for removably attaching the cover to the MEMS container; and
    an inert gas sealed inside the MEMS container and metal cover.

12. The apparatus of claim 11 wherein the inert gas is nitrogen or helium.

13. An apparatus comprising:
a MEMS structure;
a MEMS package enclosing the MEMS structure, the MEMS package comprising:
a MEMS container having a bottom and walls;
a cover with a glass pane;
an elastomeric gasket mounted between the walls of the MEMS container and the cover;
a plurality of attachment mechanisms for removably attaching the cover to the MEMS container; and
a glue or epoxy fastening the elastomeric gasket to the bottom perimeter of the cover.

* * * * *